(12) United States Patent
Liu et al.

(10) Patent No.: US 9,385,718 B1
(45) Date of Patent: Jul. 5, 2016

(54) INPUT-OUTPUT BUFFER CIRCUIT WITH A GATE BIAS GENERATOR

(71) Applicant: Altera Corporation, San Jose, CA (US)

(72) Inventors: Jun Liu, Milpitas, CA (US); Yanzhong Xu, Santa Clara, CA (US); Bonnie I. Wang, Cupertino, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/058,117

(22) Filed: Oct. 18, 2013

(51) Int. Cl.
*H03K 19/00* (2006.01)
*H03K 19/0175* (2006.01)
*H03K 19/017* (2006.01)

(52) U.S. Cl.
CPC .... *H03K 19/017509* (2013.01); *H03K 19/0005* (2013.01); *H03K 19/0013* (2013.01); *H03K 19/01721* (2013.01)

(58) Field of Classification Search
CPC .......... H03K 19/0005; H03K 19/0013; H03K 19/00315; H03K 19/0361; H03K 19/00384; H03K 19/01721; H03K 19/09448; H03K 19/0952; H04L 25/0272; H04L 25/0278; H04L 25/028; H04L 25/0282; H04L 25/0292
USPC ......................................... 326/25–29, 82–87
See application file for complete search history.

(56) References Cited

U.S. PATENT DOCUMENTS

| | | | |
|---|---|---|---|
| 4,449,065 A | 5/1984 | Davies, Jr. | |
| 4,449,066 A | 5/1984 | Aoyama et al. | |
| 5,289,063 A | 2/1994 | Orisaka et al. | |
| 5,311,076 A * | 5/1994 | Park | G11C 7/1051 326/21 |
| 6,147,512 A * | 11/2000 | Sung | G11C 7/1078 326/82 |
| 6,362,652 B1 | 3/2002 | Oner et al. | |
| 7,148,738 B2 | 12/2006 | Knoop et al. | |
| 7,164,299 B2 * | 1/2007 | Nedachi | H03K 17/164 326/26 |
| 7,733,128 B2 * | 6/2010 | Miura | H04L 25/0282 326/115 |
| 7,772,877 B2 * | 8/2010 | Chujo | H04L 25/0278 326/30 |
| 7,821,289 B2 * | 10/2010 | Lee | H03K 5/04 326/26 |
| 7,969,197 B2 * | 6/2011 | Muraokab | H03K 19/018521 326/30 |
| 8,334,715 B1 * | 12/2012 | Muthali | H03K 19/00384 326/46 |
| 8,390,315 B1 * | 3/2013 | Wang | H03K 19/01721 326/26 |
| 2007/0194804 A1 * | 8/2007 | Kase | H03K 19/01721 326/27 |

* cited by examiner

*Primary Examiner* — Jason M Crawford
*Assistant Examiner* — Kurtis R Bahr

(57) ABSTRACT

An integrated circuit is disclosed. The integrated circuit includes an input-output (IO) buffer circuit. The IO buffer circuit further includes first and second transistors coupled in series. The first transistor receives an input signal and the second transistor receives a pulsed voltage signal. Furthermore, a method to operate the IO buffer circuit is also disclosed.

17 Claims, 8 Drawing Sheets

INPUT-OUTPUT BUFFER CIRCUIT WITH A GATE BIAS GENERATOR

BACKGROUND

Signal speed requirements have been increasing with every new generation of integrated circuits (ICs). In order to support the increasing signal speed requirements for the new generation of integrated circuits, input-output (IO) buffer circuits on integrated circuits need to be capable of transferring signals at even higher speeds.

One of the ways to increase the signal transmission speed is to shrink the channel length formed between a source terminal and a drain terminal of the transistor. Such shrinking may be a natural consequence of adopting a new semiconductor process node.

However, the shrinking of the channel length may increase a transistor's susceptibility to hot carrier injection (HCI) issues. The HCI may decrease reliability of an integrated circuit by affecting a particular transistor in the integrated circuit or, as seen in some instances, may destroy the particular transistor entirely. The HCI phenomenon may occur when an electron in a transistor channel gains sufficient energy (hence the term 'hot') to enter the dielectric of the gate of the transistor.

In general, an HCI phenomenon may be mitigated by utilizing high voltage transistors. High voltage transistors are a type of transistors that are capable of handling elevated or "overdriven" voltages at the junctions of source or drain and the channel. Therefore, high voltage transistors are generally not susceptible to HCI phenomenon. However, utilizing high voltage transistors may not be feasible at a given process node, or may require additional manufacturing process steps, resulting in an increase of the overall manufacturing cost of a product. Therefore, utilizing high voltage transistors may be undesirable.

It is within this context that the embodiments described herein arise.

SUMMARY

Embodiments described herein include an input-output (IO) buffer circuit with a gate bias generator and a method to operate the IO buffer circuit. It should be appreciated that the embodiments can be implemented in numerous ways, such as a process, an apparatus, a system, a device, or a method. Several embodiments are described below.

In one embodiment, an input-output (IO) buffer circuit is disclosed. The IO buffer circuit may be able to output a signal that shifts from one voltage level to another voltage level relatively quickly. The disclosed IO buffer circuit may be relatively insusceptible to hot carrier injection (HCI) issues. Furthermore, the IO buffer circuit may not be affected by a time-dependent dielectric breakdown (TDDB) failure that occurs when the IO buffer circuit receives a relatively high voltage for a long period of time. In addition, the IO buffer circuit may not require any additional masks for manufacturing an integrated circuit.

In one embodiment, an integrated circuit having an input-output buffer circuit is disclosed. The IO buffer circuit further includes first and second transistors coupled in series. The first transistor receives an input signal and the second transistor receives a pulsed control signal.

In another embodiment, a method of operating an input-output (IO) buffer circuit that includes first and second transistors is disclosed. The method includes receiving a first input signal on a gate terminal of the first transistor. The method further includes receiving a pulsed control signal on a gate terminal of the second transistor.

In an alternative embodiment, a method of operating an input-output (IO) buffer circuit that includes first and second transistors is provided. The method includes receiving an input signal with the first transistor. The input signal may shift from a first voltage level to a second voltage level. The method also includes receiving a pulsed control signal with the second transistor. The pulsed control signal has a nominal value at the second voltage level and a pulse value at a third voltage level. The second transistor may be placed in an enhanced state when receiving the third voltage level on the gate terminal. The enhanced state may speed up the shifting of the IO buffer circuit from one state to another state.

Further features of the invention, its nature and various advantages will be more apparent from the accompanying drawings and the following detailed description of the preferred embodiments.

DETAILED DESCRIPTION

The following embodiments describe an input-output (IO) buffer circuit with a gate bias generator and a method of operating the IO buffer circuit. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
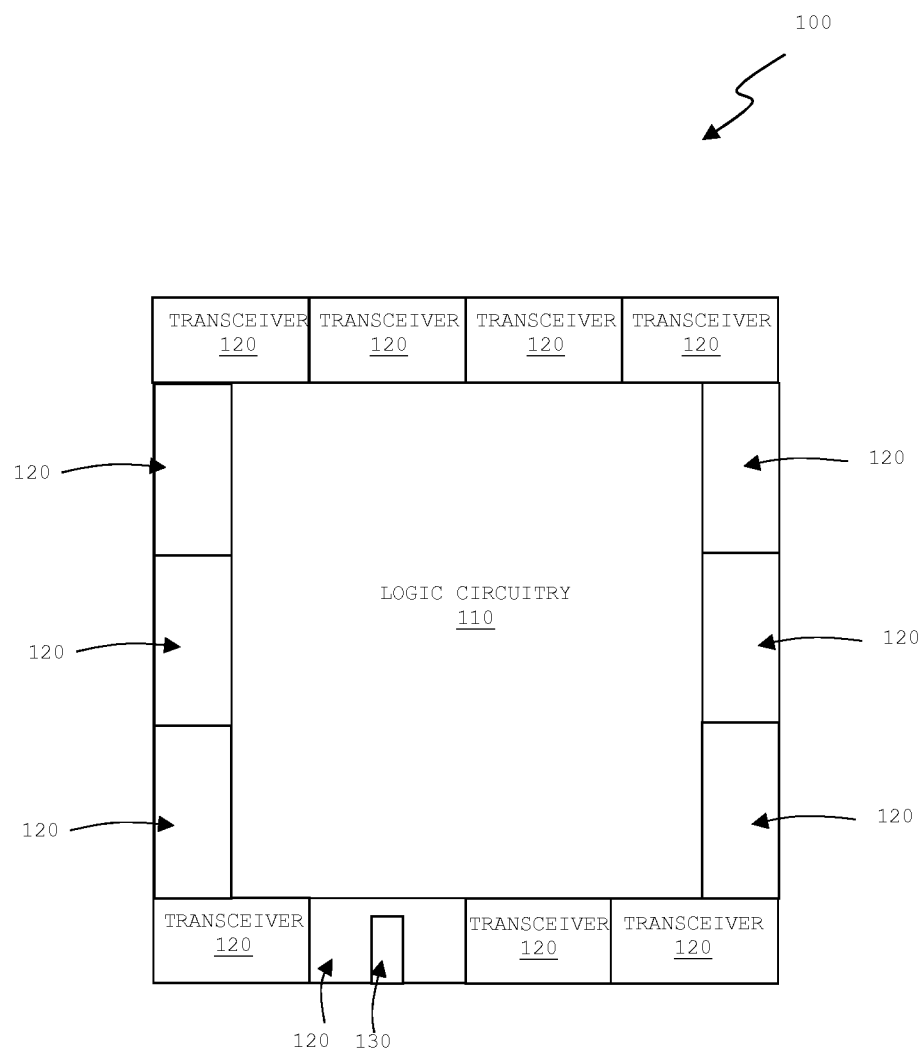
FIG. 1 shows an illustrative integrated circuit in accordance with one embodiment of present invention.

FIG. 1, meant to be illustrative and not limiting, illustrates integrated circuit 100 in accordance with one embodiment of present invention. Integrated circuit 100 may be an application specific integrated circuit (ASIC) device, an application standard specific product (ASSP) device or a programmable logic device (PLD). In general, ASIC and ASSP devices may perform fixed and dedicated functions, whereas PLD devices may be programmable to perform a variety of functions. An example of a PLD device may be a field programmable gate array (FPGA) device.

Integrated circuit 100 may be used in different communication systems such as wireless systems, wired systems, etc. In one embodiment, integrated circuit 100 may be a PLD that is utilized for controlling data transfer between different devices, for example, microprocessor devices and memory devices. Hence, integrated circuit 100 may include circuits that may be used to implement various protocol standards that allow integrated circuit 100 to communicate with external devices such as memory devices that may be coupled to integrated circuit 100 (not shown). An example of a memory communications standard may be the Joint Electronic Devices Engineering Council (JEDEC) memory standard.

Integrated circuit 100 may include logic circuitry 110 and transceivers 120. In the embodiment of FIG. 1, transceivers 120 may be located on the peripheral portion of integrated circuit 100, whereas logic circuitry 100 may occupy the central portion of integrated circuit 100. It should be appreciated that the arrangement of transceivers 120 and logic circuitry 110 on integrated circuit 100 may vary depending on the requirements of a particular device.

Logic circuitry 110 may be utilized for performing core functions of integrated circuit 100. It should be appreciated that logic circuitry 110 may include circuits specific to the functions that define integrated circuit 100. For example, logic circuitry 110 may include circuits that perform memory device addressing and processing of information retrieved from the memory device when integrated circuit 100 is used as a memory controller. In another example, logic circuitry 110 may include programmable logic elements when integrated circuit is a PLD. The programmable logic elements may further include circuits such as look-up table circuitry, multiplexers, product-term logic, registers, memory and the like. The programmable logic elements may be programmed by a user (e.g., a designer or an engineer) to perform any desired function.

Signals from logic circuitry 110 may be transferred out of integrated circuit 100 through one of the transceivers 120. Additionally, signals received from an external device (external to integrated circuit 100) may be transferred to logic circuitry 110 through one of the transceivers 120. Therefore, transceivers 120 may be considered as external interfacing circuitry of integrated circuit 100.

Referring still to FIG. 1, any or all of the transceivers 120 may further include input-output (IO) buffer circuit 130. IO buffer circuit 130 may be utilized for aligning the speeds of input/output signals of one or more of transceivers 120. IO buffer circuit 130 may include an input circuit element, an output circuit element, an ESD protection element, and the like. In an exemplary embodiment, IO buffer circuit 130 may include circuitry such as that illustrated in FIG. 2.

Figure 2:
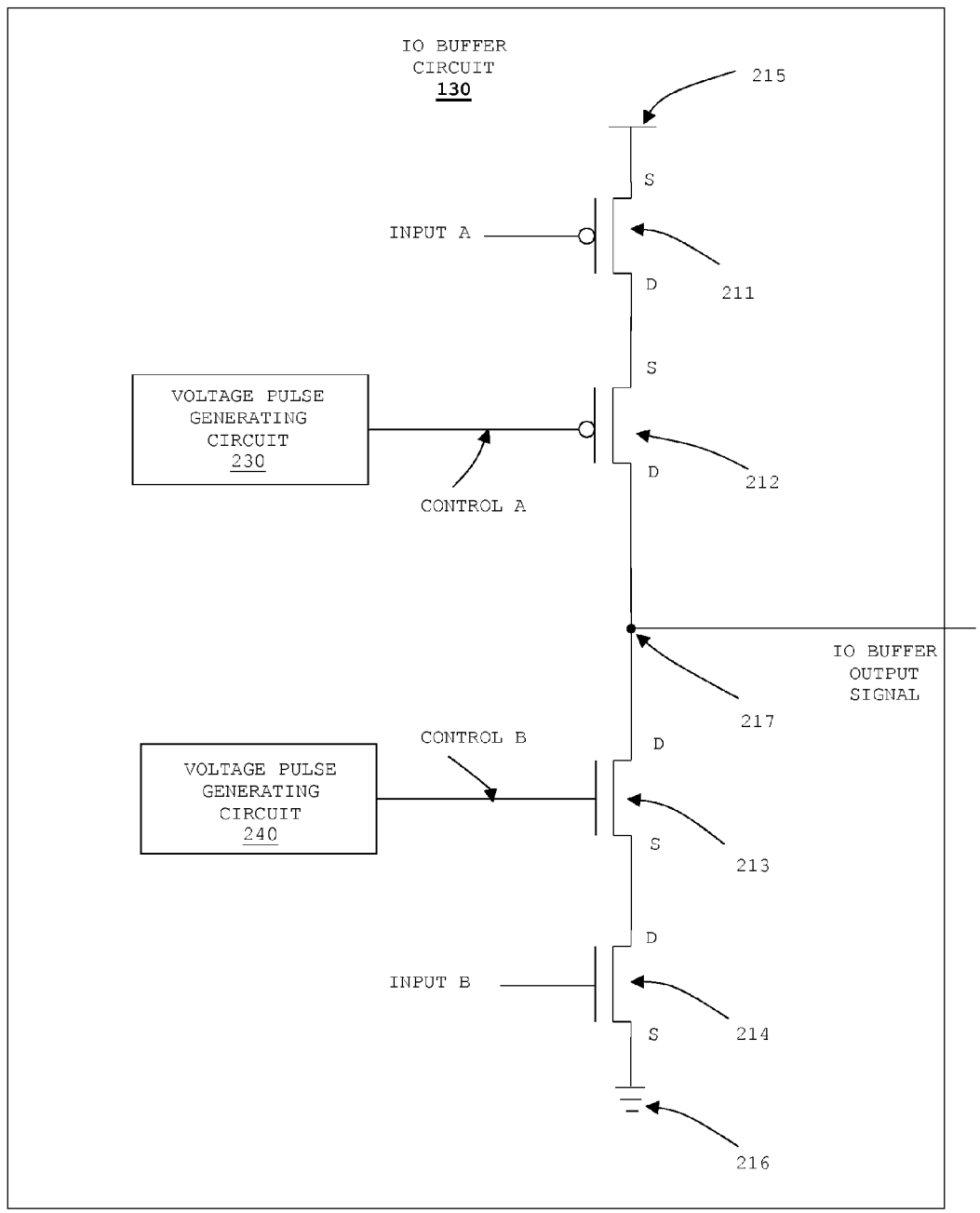
FIG. 2 shows an illustrative input-output (IO) buffer circuit in accordance with one embodiment of the present invention.

FIG. 2, meant to be illustrative and not limiting, shows a circuit diagram of an IO buffer circuit in accordance with one embodiment of the present invention. In one instance, the circuit shown within IO buffer circuit 130 may be a circuit for an output buffer that is utilized for transferring signals out of integrated circuit 100. IO buffer circuit 130 may include two p-channel metal oxide semiconductor (PMOS) transistors 211 and 212, two n-channel metal oxide semiconductor (NMOS) transistors 213 and 214, and two voltage pulse generating circuits 230 and 240.

In FIG. 2, PMOS transistors 211 and 212 and NMOS transistors 213 and 214 are coupled in series. For clarity, the source and drain terminals of each transistor in FIG. 2 are labeled as S and D, respectively. In the embodiment of FIG. 2, the drain terminal of PMOS transistor 211 may be coupled to the source terminal of PMOS transistor 212. In addition to that, the drain terminal of PMOS transistor 212 may be coupled to the drain terminal of NMOS transistor 213. Furthermore, the source terminal of NMOS transistor 213 may be coupled to the drain terminal of NMOS transistor 214.

Transistors 211-214 may be coupled in series between positive power supply terminal 215 and ground power supply terminal 216. As shown in FIG. 2, the source terminal of PMOS transistor 211 may be coupled to power supply terminal 215 and the source terminal of NMOS transistor 214 may be coupled to ground terminal 216. In one embodiment, power supply terminal 215 may have a voltage level of 3.0 volts (V).

Output terminal 217 of IO buffer circuit 130 may be coupled to the drain terminal of PMOS transistor 212 and the source terminal of NMOS transistor 213. Hence, as shown in FIG. 2, output terminal 217 may be located between PMOS transistors 212 and NMOS transistors 213. Output terminal 217 may be further coupled to an IO pin (not shown) on the integrated circuit device. In one embodiment, output terminal 217 may provide a signal (i.e., an IO signal) that toggles between 0 V and 3.0 V.

A gate terminal of PMOS transistor 211 may receive a first input signal (i.e., INPUT A), whereas a gate terminal of NMOS transistor 214 may receive a second input signal (i.e., INPUT B). In one instance, INPUT A may be a voltage input that swings between 1.5 V and 3.0 V and INPUT B may be a voltage input that swings between 0 V and 1.5 V. In another instance, the INPUT B may be a voltage input that swings between 0 V and 1.8 V.

A gate terminal of PMOS transistor 212 may be coupled to voltage pulse generating circuit 230, whereas a gate terminal of NMOS transistor 213 may be coupled to voltage pulse generating circuit 240. Voltage pulse generating circuits 230 and 240 may sometimes be referred to as pulse control generation circuits. In one instance, voltage pulse generating circuit 230 may provide a control signal (i.e., CONTROL A) having a nominal voltage of 1.5 V with a temporary dip in voltage (similar to a negative pulse) to 1.35 V. Accordingly, voltage pulse generating circuit 240 may provide another control signal (i.e., CONTROL B) having a nominal voltage of 1.5 V with a temporary spike to 2.25 V. In one embodiment, CONTROLS A and B may also be known as pulsed control signals. The voltage spike for CONTROL B signal and voltage dip for CONTROL A may enhance a signal transmission speed across channels (i.e., may increase the drive strength of the transistor) of NMOS transistor 213 and PMOS transistor 212, respectively. Furthermore, the voltage spike for CONTROL B may reduce HCI issues across the channel of NMOS transistor 213 when the IO BUFFER OUTPUT is signal is pulled to ground level.

Even though a specific number of PMOS and NMOS transistors are shown in the embodiment of FIG. 2, it should be appreciated that IO buffer circuit 130 may include more than two PMOS transistors 211 and 212 and/or NMOS transistors 213 and 214. Apart from the transistors, IO buffer circuit 130 may include capacitors (not shown) that may be coupled in a shunt configuration to output terminal 217. PMOS transistors 211 and 212 and NMOS transistors 213 and 214 may have a time-dependent dielectric breakdown (TDDB) limit of 1.92 V. It should be appreciated that the TDDB limit refers to the point when a transistor begins to degrade (i.e., when the transistor receives a voltage level that is higher than its TDDB limit at its gate terminal). Furthermore, PMOS transistors 211 and 212 and NMOS transistors 213 and 214 may include a source-drain voltage (Vds) limit of 2.0 V. Having a source-drain voltage that is greater than the source-drain voltage limit (e.g., 2.0 V) may increase the chances of the hot carrier injection phenomenon.

Figure 3:
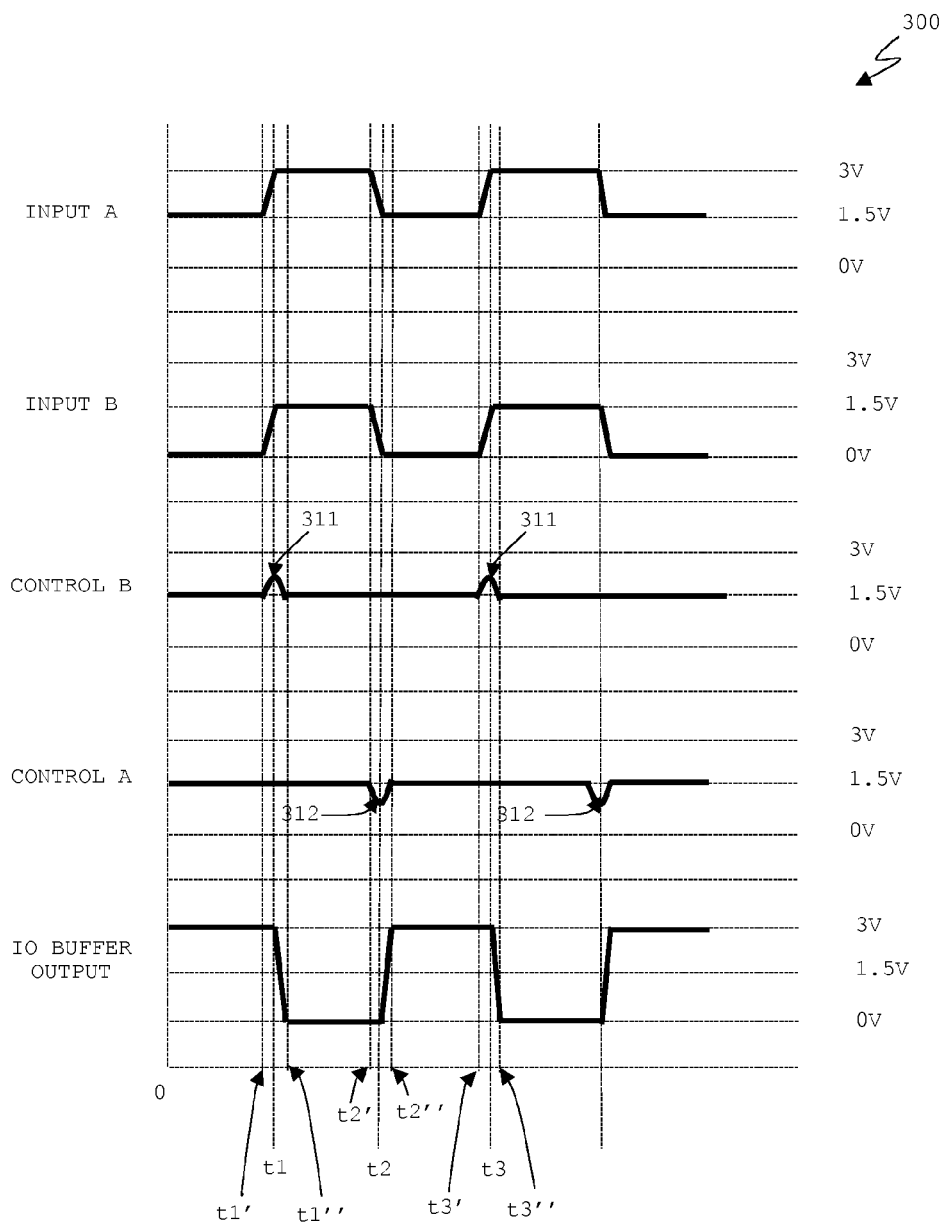
FIG. 3 shows illustrative waveforms of signals within an IO buffer in accordance with one embodiment of the present invention.

FIG. 3, meant to be illustrative and not limiting, depicts waveforms of signals within an IO buffer, such as IO buffer circuit 130 of FIG. 2, in accordance with one embodiment of the present invention. Waveforms 300 include waveforms of INPUTS A and B, CONTROLS A and B and IO BUFFER OUTPUT. Waveforms 300 may describe the behavior of various signals in IO buffer circuit 130 of FIG. 2. The X-axis for waveforms 300 represents time (in seconds) and the Y-axis for waveforms 300 represents voltage levels (V) for the five signals, wherein each signal may vary between 0 V to 3.0 V.

As shown in FIG. 3 and with continuing reference to FIG. 2, between time 0 to time t1', INPUT A (received at the gate terminal of PMOS transistor 211) may be at 1.5 V; INPUT B (received at the gate terminal of NMOS transistor 214) may be at 0 V; CONTROL A (received at the gate terminal of PMOS transistor 212) may be at 1.5; CONTROL B (received at the gate terminal of NMOS transistor 213) may be at 1.5 V; and the IO BUFFER OUTPUT may be at 3.0 V. Therefore, NMOS transistor 214 may not be active at this point because INPUT B is at 0 V. Conversely, PMOS transistors 211 and 212 are active because the INPUT A and the CONTROL A are both at 1.5 V (gate voltage being significantly lower than supply voltage of 3.0 V). Hence, the voltage levels of 3.0 V at their source terminals are transmitted through the respective channels of PMOS transistors 211 and 212 to output terminal 217.

However, during the duration of time t1' to time t1, CONTROL B may begin receiving a voltage pulse 311. In one embodiment, voltage pulse 311 may be received from voltage pulse generating circuit 240 of FIG. 2. Voltage pulse 311 in the CONTROL B may be generated when the INPUT A shifts from 1.5 V to 3.0 V and when the INPUT B shifts from 0 V to 1.5 V. It should be appreciated that the transition for the INPUTS A and B has to be synchronous with the transition on the CONTROL B for voltage pulse 311. Furthermore, voltage pulse 311 may be a relatively short pulse (e.g., less than eight percent of a period of a signal cycle) that occurs between time t1' and t1" (and between time t3' and t3"). Therefore, NMOS transistor 213 may not be affected by TDDB degradation. Accordingly, INPUT A shifts from 1.5 V to 3.0 V, and INPUT B shifts from 0 V to 1.5 V between times t1' and t1. The transition for the respective signals (i.e., CONTROL B and INPUTS A and B) may be completed at time t1.

As shown in FIG. 3, at time t1, INPUT A is at 3.0 V, INPUT B is at 1.5 V, CONTROL A remains at 1.5 V and CONTROL B may reach its peak at 2.25 V. The IO BUFFER OUTPUT at time t1 may begin its transition from 3.0 V to 0 V. As an example, at time t1, NMOS transistor 214 may be active (having a gate terminal voltage of 1.5 V) while NMOS transistor 213 may also be active (having a gate terminal voltage of 2.25 V). At this point, PMOS transistor 211 may be deactivated because the voltage level at its source terminal is identical to that at its gate terminal (e.g., 3.0 V).

In one embodiment, increasing the voltage level at the gate terminal of NMOS transistor 213 to greater than 1.5 V may temporarily enhance the voltage pull-down capability at output terminal 217. It should be appreciated that NMOS transistor 213 may be able to pull down the voltage at output terminal 217 faster because a relatively high gate voltage level (e.g., 2.25 V) enables a signal to transmit through NMOS transistor 213 at a relatively faster rate. At the interval between time t1 and t1", the voltage level of CONTROL B may start to drop from its peak voltage level (e.g., 2.25 V) to its nominal voltage level (e.g., 1.5 V) and the IO BUFFER OUTPUT may begin its transition from 3.0 V towards 0 V.

In the embodiment of FIG. 3, between time t1" and t2', INPUTS A and B do not change (e.g., both inputs may remain at 3.0 V and 1.5 V, respectively). Accordingly, CONTROLS A and B may remain at their nominal voltage level (e.g., both at 1.5 V), and IO BUFFER OUTPUT may remain at 0 V.

Between time t2' and t2, INPUTS A and B may begin their respective transitions (e.g., INPUT A may transition from 3.0 V to 1.5 V and INPUT B may transition from 1.5 V to 0 V). At this point, CONTROL B remains at its nominal voltage level (i.e., 1.5 V) while CONTROL A begins to receive a pulse signal 312. In one instance, pulse signal 312 may be received from voltage pulse generating circuit 230. Voltage pulse 312 in the CONTROL A may be generated when the INPUT A shifts from 3.0 V to 1.5 V and the INPUT B shifts from 1.5 V to 0 V. As described above, the transition for the INPUTS A and B is synchronous with the transition on the CONTROL B for voltage pulse 311.

At time t2, the INPUT A is at 1.5 V, INPUT B is at 0 V, CONTROL B remains at 1.5 V and CONTROL A reaches its maximum voltage dip of 1.35 V. IO BUFFER OUTPUT at time t2 may begin its transition from 0 V to 3.0 V. Hence, PMOS transistor 211 may be active (e.g., when the voltage at its gate terminal is 1.5 V) and PMOS transistor 212 and may also be active (e.g., when the voltage at its gate terminal is 1.35 V). At this point, NMOS transistor 214 may not be active because the voltage level at its gate terminal is 0 V.

In one embodiment, voltage pulse 312 may temporarily enhance the capability of PMOS transistor 212 to pull up the voltage level at output terminal 217. When the voltage level at its gate is below 1.5 V, PMOS transistor 212 may be able to pull up the voltage level at output terminal 217 relatively faster than when PMOS transistor 212 having its gate terminal at the nominal voltage of 1.5 V. It should be appreciated that PMOS transistor 212 may be able to pull-up the voltage at output terminal 217 fast because the lower voltage level (e.g., 1.35 V) at the gate terminal of PMOS transistor 212 enables the voltage supply signal to transmit through PMOS transistor 212 relatively faster than when its gate voltage level is at a nominal value (e.g., 1.5 V). Between time t2 and t2", the CONTROL A may rise from its maximum voltage dip back to nominal voltage of 1.5 V and the IO BUFFER OUTPUT may make its transition from 0 V to 3.0 V.

From the period of t2" to t3', INPUTS A and B remains at 1.5 V and 0 V, respectively. Accordingly, control INPUTS A and B remain at the nominal voltage of 1.5 V and IO BUFFER OUTPUT remains at 3.0 V.

Referring still to FIG. 3, the INPUTS A and B and CONTROLS A and B between the period of t3' and t3" transitions similarly as to the period t1'-t1", therefore, the IO BUFFER OUTPUT may transition similarly to the period between t3' and t3". Although FIG. 3 illustrate a repetitive pattern of INPUTS A and B, it should be appreciated that the changes in INPUTS A and B depends on the logic signal that is to be transmitted out from integrated circuit 100 of FIG. 1. Accordingly, as described above, the CONTROLS A and B may depend on the transition in INPUTS A and B.

Figure 4:
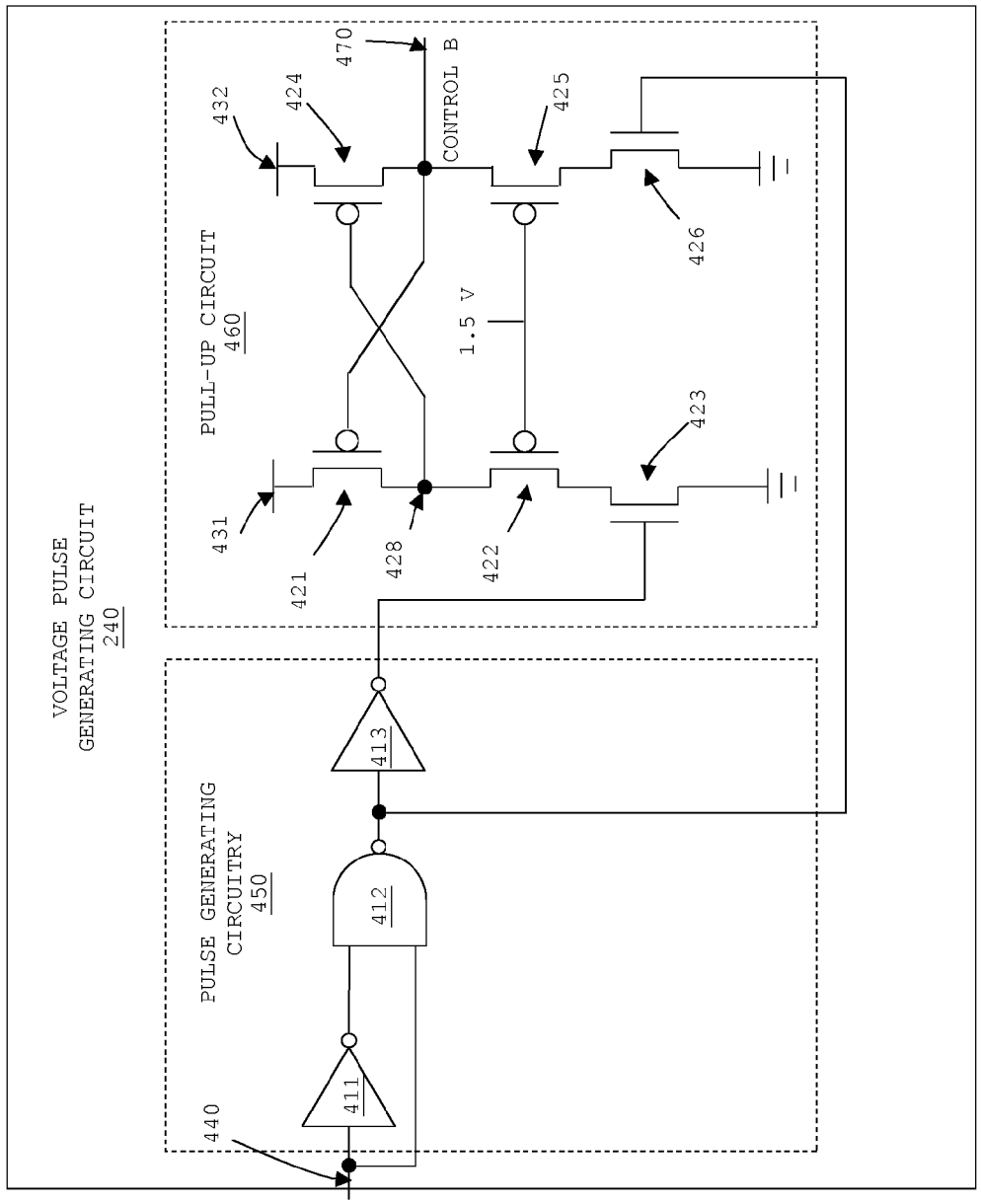
FIG. 4 shows an illustrative pulsed voltage circuit that may provide a control input for an n-channel metal oxide semiconductor (NMOS) transistor of the IO buffer circuit in accordance with one embodiment of the present invention.

FIG. 4, meant to be illustrative and not limiting, illustrates a pulsed voltage circuit that generates a control signal for an IO buffer circuit in accordance with one embodiment of the present invention. Voltage pulse generating circuit 240 may be similar to voltage pulse generating circuit 240 of FIG. 2 that is coupled to the gate terminal of NMOS transistor 213.

In the embodiment of FIG. 4, voltage pulse generating circuit 240 includes pulse generating circuitry 450 and pull-up circuit 460. Inputs for voltage pulse generating circuit 240 may be received through input terminal 440. In one embodiment, a square waveform having voltage levels that alternate regularly between 0 V and 1.0 V may be received at input terminal 440. Output signals from voltage pulse generating circuit 240 may be transmitted via output terminal 470. In one embodiment, output terminal 470 may be coupled to NMOS transistor 213 of FIG. 2. The output signals from voltage pulse generating circuit 240 may have an output waveform that is similar to the waveform of CONTROL B as shown in FIG. 3.

Pulse generating circuitry 450 may generate a pulse signal with a reference voltage of 0 V (i.e., the pulse starts to rise from 0 V). The peak voltage of the pulse signal may be at 1.0 V. In one embodiment, pulse generating circuitry 450 includes inverters 411 and 413 and NAND gate 412. The square waveform received at input terminal 440 may be converted to pulse signals at the output terminal of inverter 413.

It should be appreciated that in any inverter (e.g., inverter 411), there would be a delay from the time an input signal is received at the input terminal of the inverters to the point where an output signal is outputted through an output terminal of the inverters. In one embodiment, when the square waveform transitions from the logic low value to the logic high value, there will be a delay before inverter 411 shifts its output signal from logic high value (i.e., inversion of logic low value) to logic low value (i.e., inversion of logic high value). During that momentary delay, both input terminals of NAND gate 412 will be at the logic high value, therefore, outputting a signal at logic low value from NAND gate 412. At other instances, (e.g., when the square waveforms is at constant logic high value, when the square waveform is in constant logic low value or when the square waveform is in transition state from logic high value to logic low value) the output from NAND gate 412 may be at the logic high value and the output from inverter 413 may be at the logic low value. Subsequently, the output from NAND gate 412 is inverted by inverter 413.

The pulse signals may be supplied to the gate terminal of NMOS transistor 423 and an inverted version of the pulse signals may be supplied to the gate terminal of NMOS transistor 426 in pull-up circuit 460.

Pull-up circuit 460 may shift the nominal voltage of the pulse signals from 0 V to 1.5 V. Furthermore, pull-up circuit 460 may also shifts the peak voltage of the pulse signals from 1.0 V to 2.25 V. Pull-up circuit 460 may include four PMOS transistors 421, 422, 424 and 425 in addition to the already mentioned NMOS transistors 423 and 426. In one embodiment, the arrangement of pull-up circuit 460 may be similar to the arrangement as shown in FIG. 4. Pull-up circuit 460 may receive power supply voltage signals from power supply terminals 431 and 432. In FIG. 4, power supply terminal 431 may be coupled to the source terminal of PMOS transistor 421 whereas power supply terminal 432 may be coupled to the source terminal of PMOS transistor 424. In one instance, the voltage level supplied by respective power supply terminals 431 and 432 is 3.0 V. The respective gate terminals of PMOS transistors 422 and 425 may be coupled to a voltage bias, for example, 1.5 V.

In one instance, NMOS transistors 423 and 426 may be activated when the voltage level received at their respective gate terminals is at a logic high level (e.g., 1.0 V). Accordingly, when NAND gate 412 outputs a logic high level (e.g., when the output has a voltage level of 1.0 V) and when inverter 413 outputs a logic low level (e.g., when the output is at 0 V), NMOS transistors 426 and 423 may be activated and deactivated, respectively.

Consequently, the source-drain terminal of PMOS transistor 425 that is coupled to NMOS transistor 426 may be at 0 V. As in the embodiment of FIG. 4, the gate bias voltage for PMOS transistor 425 is at 1.5 V. Therefore, the voltage drop across the source-drain terminals of the PMOS transistor may be 1.5 V. And for that reason, output terminal 470 will be at 1.5 V, which corresponds similarly to CONTROL B signal of FIG. 3 between time 0 and t1', and between time t1" and t3'. In addition, the gate terminal for PMOS transistor 421 will be at 1.5 V and node 428 will be at 2.25 V (as a result of 3.0 V-0.75 V (an exemplar threshold voltage for PMOS transistor 421)). The gate terminal of PMOS transistor 424 will also be at 2.25 V, which will effectively deactivate PMOS transistor 424.

In another instance, NMOS transistors 423 and 426 receive the voltages of 1.0 V (at the peak) and 0 V respectively. Accordingly, NMOS transistor 423 receiving 1.0 V at its gate is activated and NMOS transistor 426 receiving 0 V at its gate is deactivated. A source-drain terminal of the PMOS transistor 422, which is coupled to NMOS transistor 423, may be at 0 V. PMOS transistor 422 also receives a bias voltage of 1.5 V similar to PMOS transistor 425. Therefore, the voltage drop across the source-drain terminals of the PMOS transistor 422 may be 1.5 V. Hence, node 428 may be at 1.5 V.

Consequently, the voltage at the gate terminal of PMOS transistor 424 will also be 1.5 V. Since, the voltage level at the gate terminal is significantly smaller than the voltage level at the source terminal for PMOS transistor 424 (e.g., 3.0 V), PMOS transistor 424 could be in "saturation" mode state, which allows the voltage from power supply terminal 432 getting transmitted to output terminal 470 less the threshold voltage of PMOS transistor 424. Given that the threshold voltage for PMOS transistor 424 may be 0.75 V, a voltage level of 2.25 V may be transmitted out from output terminal 470. The CONTROL B signal with 2.25 V correspond similarly to the CONTROL B signal from t1' to t1" and from t3'-t3" in FIG. 3. It should also be appreciated that at that instance, the gate terminal for PMOS transistor 421 will be at 2.25 V that may deactivate PMOS transistor 421.

Figure 5:
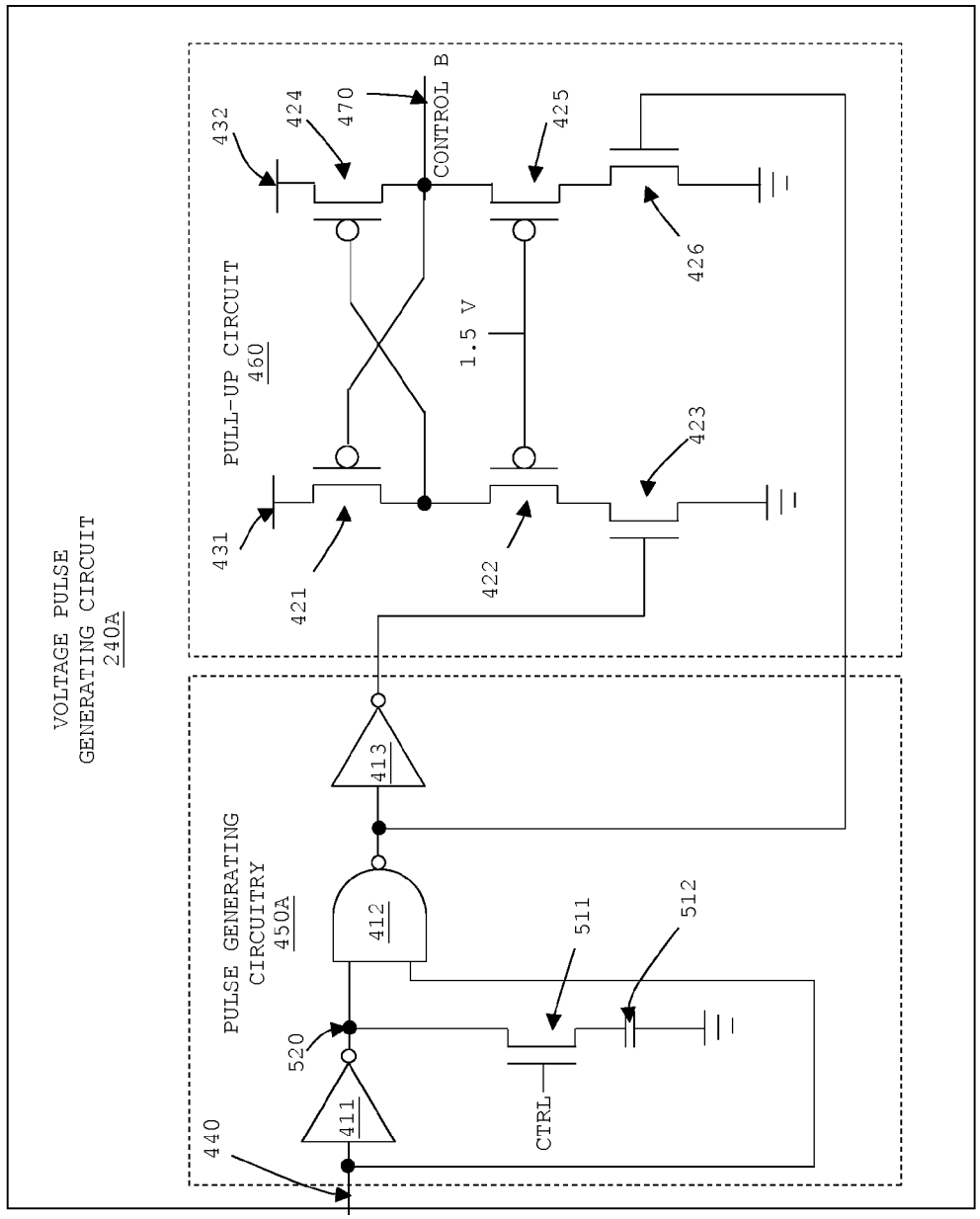
FIG. 5 shows another illustrative pulsed voltage circuit that generates a control input for an NMOS transistor of the IO buffer circuit in accordance with one embodiment of the present invention.

FIG. 5, meant to be illustrative and not limiting, illustrates another pulsed voltage circuit that may provide a control input to a buffer circuit in accordance with one embodiment of the present invention. It should be appreciated that voltage pulse generating circuit 240A may be similar to voltage pulse generating circuit 240 shown in FIG. 4 with an additional circuit to control the width and/or magnitude of a pulse signal generated by pulsed generating circuitry 450A. Hence, for the sake of brevity, circuit elements in voltage pulse generating circuit 240A that are similar to those shown in voltage pulse generating circuit 240 of FIG. 4 will not be repeated.

In the embodiment of FIG. 5, pulse generating circuitry 450A includes two additional circuit components such as NMOS transistor 511 and capacitor 512, which are coupled to node 520 on the electrical pathway coupling inverter 411 and NAND gate 412. The additional components may be used to adjust the width and magnitude of the pulse. NMOS transistor 511 may receive a control signal (CTRL) at its gate terminal. A pathway to capacitor 512 is established when the CTRL signal activates NMOS transistor 511. Subsequently, capacitor 512 builds up electrical charges across its terminals. In one instance, the CTRL signal may be received from a register or a latch (not shown), which may be programmed by a user.

The electrical charges stored in capacitor 512 may be discharged to maintain the voltage level of node 520 at 1.0 V when the square waveform at input terminal 440 transitions from 0 V to 1.0 V. However, the discharge of electrical charges may only maintain the voltage level at 1.0 V for a brief moment. The discharge of electrical charges from capacitor 512 may shift the moment when the voltage level drops from 1.0 V to 0 V at node 520. The shift may affect the amount of time the logic high value overlaps on the input terminals of NAND gate 412 (which as discussed in FIG. 4 generates the pulsed signal). Consequently, this may affect the width and magnitude of the pulse generated out from NAND gate 412. It should be appreciated that there are many other alternative circuit configurations to change the width and magnitude of the pulse signal. In one embodiment, additional inductors and/or capacitors (not shown) may be coupled at node 520 to change the width and magnitude of the pulse signal.

Figure 6:
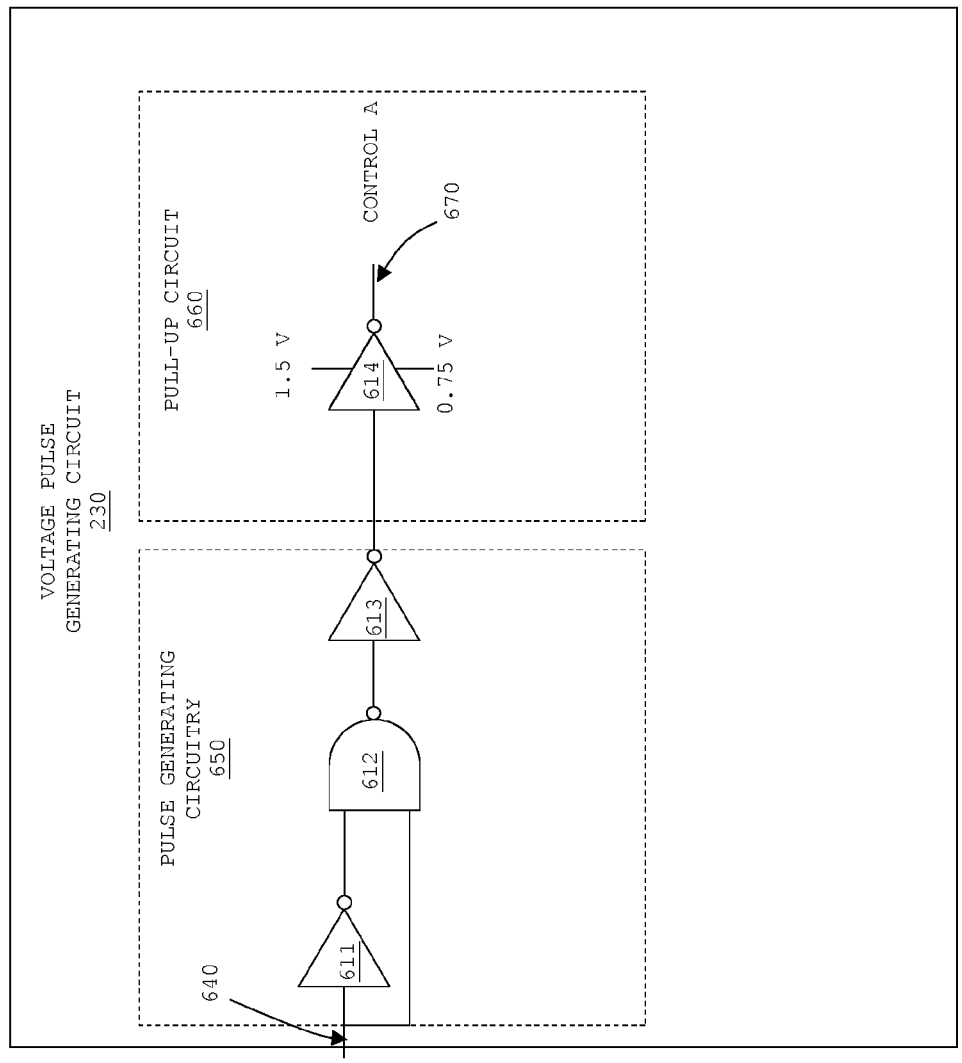
FIG. 6 shows an illustrative pulsed voltage circuit that generates another control input for a p-channel metal oxide semiconductor (PMOS) transistor of the IO buffer circuit in accordance with one embodiment of the present invention.

FIG. 6, meant to be illustrative and not limiting, illustrates a pulsed voltage circuit that may provide another control input in accordance with one embodiment of the present invention. Voltage pulse generating circuit 230 may be similar to voltage pulse generating circuit 230 of FIG. 2, which is coupled to the gate terminal of NMOS transistor 212.

As shown in FIG. 6, voltage pulse generating circuit 230 may include pulse generating circuitry 650 and pull-up circuit 660. Pulse generating circuitry 650 shares similarities with pulse generating circuitry 450 of FIG. 4. As such, similar circuit elements (e.g., inverters 611 and 613 and NAND gate 612) will not described in detail again. In the embodiment of FIG. 6, pulse generating circuitry 650 includes inverter 614 that may be coupled to the output of inverter 613. Inverter 614 may provide a logic high voltage at 0 V and a logic low voltage at −1.0 V.

A pulse signal generated by inverter 613 may have a voltage peak of 1.0 V (when the pulse signal is at logic high level) and a nominal voltage of 0 V (when the pulse signal is at logic low level). Accordingly, inverter 614 may adjust the pulse signal such that its nominal voltage remains at 1.5 V (when the output from inverter 614 is at logic high level) but its voltage peak level may be adjusted to 0.75 V (when the output from inverter 614 is at logic low level).

Similar to voltage pulse generating circuit 240 in the embodiment of FIG. 4, voltage pulse generating circuit 230 may receive input signals at input terminal 640. The input signals may form a square waveform input with voltage levels that alternate essentially regularly between 0 V and 1.0 V. Output signals of voltage pulse generating circuit 230 may be transmitted out through output terminal 670. In one embodiment, output terminal 670 may be coupled to NMOS transistor 212 of FIG. 2. An output waveform of the output signals of voltage pulse generating circuit 230 may be similar to the waveform of the CONTROL A signal as shown in FIG. 4.

Figure 7:
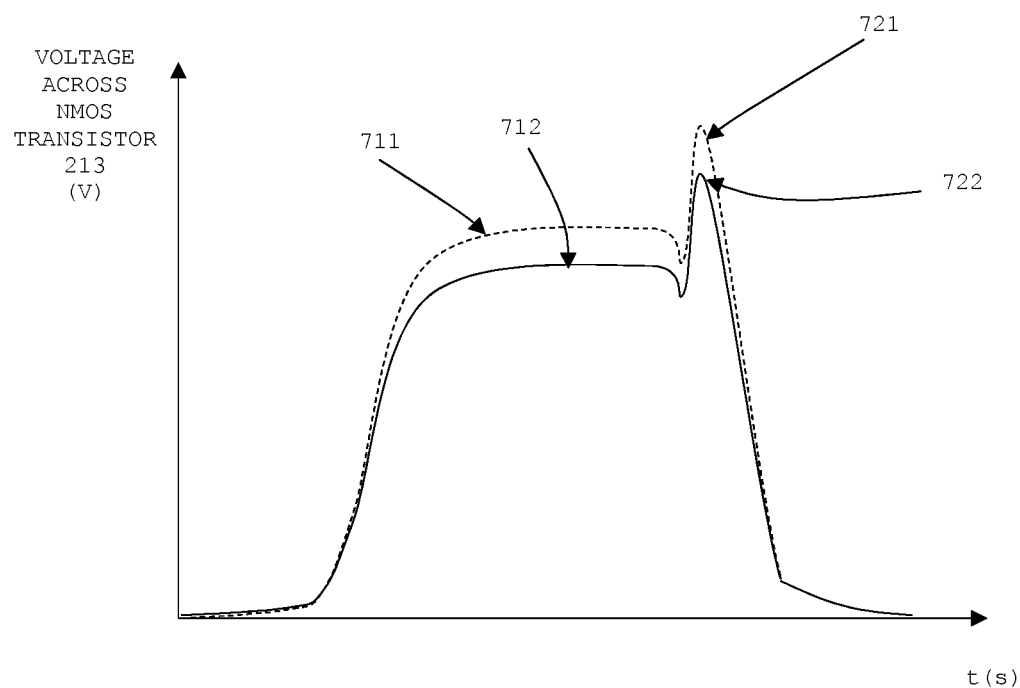
FIG. 7 plots the voltage applied across source-drain terminals for an n-channel transistor versus time in accordance with one embodiment of the present invention.

FIG. 7, meant to be illustrative and not limiting, depicts two voltage plots showing improvements in voltage level variations across the source and drain terminals of NMOS transistor 213 in accordance with one embodiment of the present invention. As an example, voltage plot 711 may represent the voltage drop across NMOS transistor 213 of FIG. 2 when its gate terminal is supplied with a fixed voltage of 1.5 V. Voltage plot 712 may represent the voltage drop across NMOS transistor 213 when its gate terminal is coupled to voltage pulse generating circuit 240 of FIG. 2. In accordance with the embodiments disclosed herein, voltage plots 711 and 712 depict the voltage level across NMOS transistor 213 when the IO BUFFER OUTPUT of FIG. 3 is between the period of t2'-t3".

As shown in FIG. 7, voltage peak 721 for voltage plot 711 may be relatively higher than voltage peak 722 of voltage plot 712. In one embodiment, voltage peak 721 may be at 2.35 V while voltage peak 722 may be at 2.0 V. The lower voltage value for voltage peak 722 compared to voltage peak 721 may reduce reliability issues such as the HCI issues. Furthermore, the lower voltage value for voltage peak 722 may also increase the transistor's lifespan (for example, by at least 2.6 times).

Figure 8:
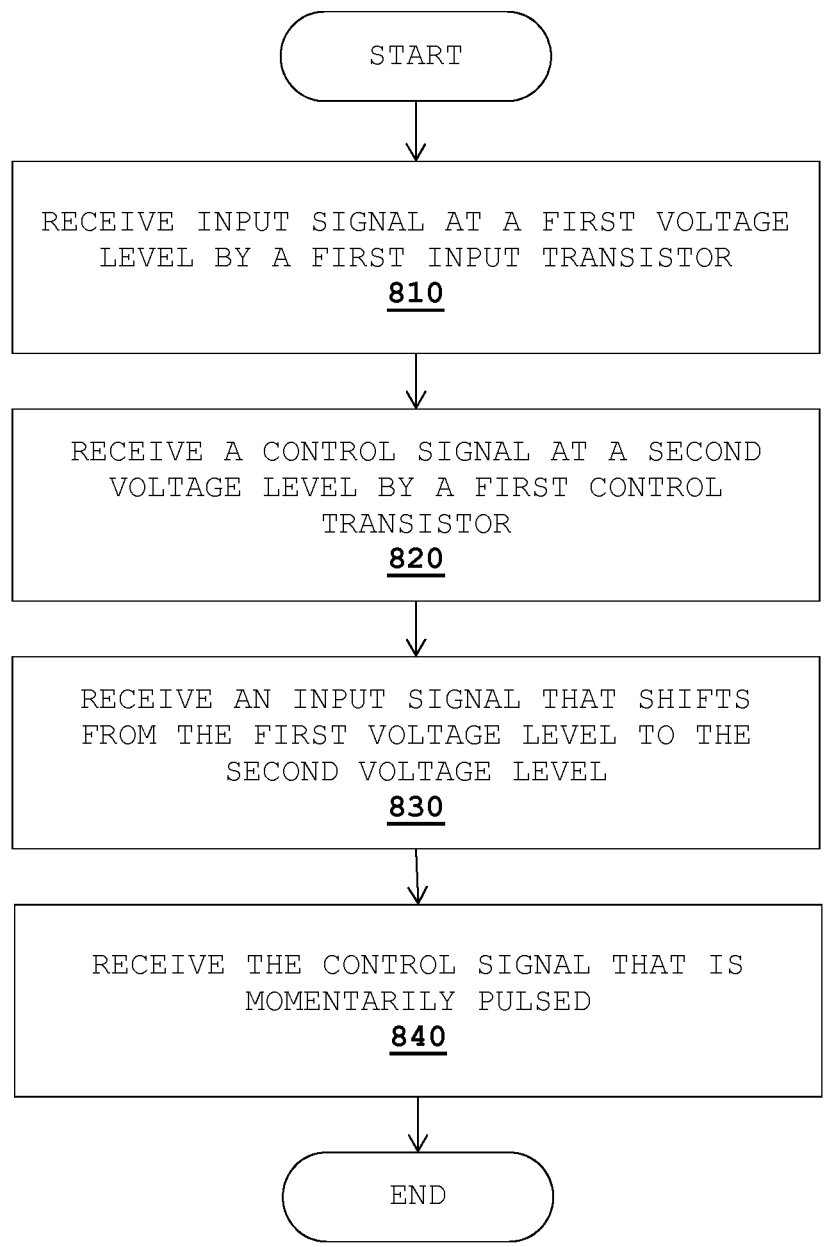
FIG. 8 shows an illustrative flowchart of steps for operating an IO buffer circuit in accordance with one embodiment of the present invention.

FIG. 8, meant to be illustrative and not limiting, illustrates a method of operating an IO buffer circuit in accordance with one embodiment of the present invention. The method may reflect the operations of signals within IO buffer circuit 130 of FIG. 2.

At step 810, an input signal at a first voltage level may be received by a first input transistor. In one embodiment the input signal may be input signal B of FIG. 3, which has a voltage level of 0 V between time 0 and t1' or between t2" and t3' of FIG. 3. The first input transistor may be NMOS transistor 214 of FIG. 2.

Alternatively, at step 810, the input signal may be input signal A, which is at a voltage level of 1.5 V between time t1" and t2' of FIG. 3. In this instance, the first input transistor may be PMOS transistor 211 of FIG. 2.

At step 820, a control signal at a second voltage level may be received by a first control transistor. In one instance, the control signal may be CONTROL B at a voltage level of 1.5 V received at the gate terminal of NMOS transistor 213. This may be represented by the waveform of the CONTROL B signal between time 0 and t1' or t2" and t3' as shown in FIG. 3. Alternatively, the control signal may be CONTROL A, which is at a voltage level of 1.5 V, and the first control transistor may be PMOS transistor 212 of FIG. 2. This may be represented by the waveform of the CONTROL A signal between time t1" and t2' in FIG. 3.

At step 830, the input signal received by the first input transistor is shifted from the first voltage level to the second voltage level. In one embodiment, this may be similar to the INPUT B signal of FIG. 3 between time t1' and t1" or between t3' and t3", when the voltage level of INPUT B increases from 0 V to 1.5 V. Alternatively, this may be similar to INPUT A signal of FIG. 3 between time t2' and t2", where the INPUT A decreases from 3.0 V to 1.5 V.

At step 840, a pulsed voltage may be received as the control signal. In one embodiment, this may be shown by voltage pulse 311 on the CONTROL B signal between the time t1' and t1" or between t3' and t3" of FIG. 3, when the CONTROL B signal increases from 1.5 V to 2.25 V. During that period, a transistor receiving the pulsed control signal (e.g., NMOS transistor 213 of FIG. 2) has a better drive strength compared to a transistor not receiving an input signal (e.g., NMOS transistor 214 of FIG. 2).

Alternatively, this may be similar to voltage pulse 312 in the CONTROL A signal of FIG. 3 between time t2' and t2", where the CONTROL A signal drops from 1.5 V to 1.3 V. During that period, a transistor receiving the pulsed control signal (e.g., PMOS transistor 212 of FIG. 2) has a better drive strength compared to a transistor an input signal (e.g., PMOS transistor 211 of FIG. 2). In one embodiment, the method in FIG. 8 may reduce an IO BUFFER OUTPUT delay from an IO buffer circuit, such as IO buffer circuit 130 of FIG. 2, by at least 30%.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An input-output buffer circuit, comprising:
   a first transistor that receives a first input signal that swings between a first voltage level and a second voltage level that is greater than the first voltage level;
   a second transistor that receives a pulsed control signal, wherein the pulsed control signal temporarily enhances the performance of the second transistor; and
   a third transistor that is coupled in series with the first and second transistors and that receives a second input signal that swings between the second voltage level and a third voltage level that is greater than the second voltage level.

2. The input-output buffer circuit as defined in claim 1, wherein the first and second transistors are selected from at least one of: an n-channel transistor and a p-channel transistor.

3. The input-output buffer circuit as defined in claim 1, further comprising:
   a power supply terminal; and
   an output terminal, wherein the first and second transistors are coupled between the output terminal and the power supply terminal of the input-output buffer circuit.

4. The input-output buffer circuit as defined in claim 3, wherein the power supply terminal comprises a ground power supply terminal.

5. The input-output buffer circuit as defined in claim 1, further comprising:
   a pulse control generation circuit that outputs the pulsed control signal.

6. The input-output buffer circuit as defined in claim 5, wherein the pulse control generation circuit comprises:
   a pulse generating circuit that generates a first output signal; and
   a pull-up circuit that receives the first output signal and generates a corresponding second output signal, wherein the pull-up circuit temporarily drives the second output signal to a higher voltage level in response to detecting a spike in the first output signal.

7. The input-output buffer circuit as defined in claim 6, wherein the spike in the first output signal is characterized by a width and a magnitude, and wherein the pulse generating circuit further comprises:
   a control circuit to control the width and the magnitude of the spike in the first output signal.

8. The input-output buffer circuit as defined in claim 1, further comprising:
   a pulse control generation circuit that outputs the pulsed control signal having a temporary voltage dip.

9. The input-output buffer circuit as defined in claim 8, wherein the pulse control generation circuit comprises:
   a pulse generating circuit that generates a first output signal; and
   a pull-up circuit that receives the first output signal and generates a corresponding second output signal, wherein the pull-up circuit temporarily drives the second output signal to a lower voltage level in response to detecting a spike in the first output signal.

10. The input-output buffer circuit defined in claim 1, wherein the pulsed control signal rises temporarily above the second voltage level in response to the first input signal rising from the first voltage level to the second voltage level.

11. The input-output buffer circuit defined in claim 1, further comprising:
    a fourth transistor that is coupled in series between with the first, second, and third transistors and that receives an additional pulsed control signal, wherein the additional pulsed control signal dips temporarily below the second voltage level in response to the first input signal falling from the second voltage level to the first voltage level.

12. A method of operating an input-output buffer circuit that includes first, second, third, and fourth transistors coupled in series, comprising:
    receiving a first input signal on a gate terminal of the first transistor;
    in response to detecting a transition in the first input signal, receiving a first pulsed control signal on a gate terminal of the second transistor;
    receiving a second input signal that is different than the first input signal at a gate terminal of the third transistor; and
    in response to detecting a transition in the second input signal, receiving a second pulsed control signal on a gate terminal of the fourth transistor, wherein the first pulsed control signal includes a voltage peak that temporarily exceeds a given voltage level, wherein the second pulsed control signal includes a voltage dip that temporarily dips below the given voltage level, and wherein the first and second pulsed control signals otherwise remain at the given voltage level.

13. The method as defined in claim 12, wherein the first transistor has a first drive strength and wherein the second transistor has a second drive strength, the method further comprising:

in response to receiving a pulse in the first pulsed control signal, increasing the second drive strength of the second transistor relative to the first drive strength of the first transistor.

14. The method as defined in claim 12, wherein the third transistor has a first drive strength and wherein the fourth transistor has a second drive strength, the method further comprising:

in response to receiving the voltage dip in the second pulsed control signal, increasing the second drive strength of the fourth transistor relative to the first drive strength of the third transistor.

15. The method as defined in claim 12, wherein a pulse in the first pulsed control signal is received before the first input signal toggles from one logic state to another logic state.

16. A method of operating an input-output buffer circuit that includes first and second transistors, comprising:

with the first transistor, receiving an input signal that shifts from a first voltage level to a second voltage level that is less than the first voltage level; and with the second transistor that is coupled in series with the first transistor, receiving a pulse when the input signal shifts from the first voltage level to the second voltage level, wherein the pulse temporarily drops from the second voltage level to a third voltage level that is lower than the second voltage level.

17. The method as defined in claim 16, further comprising:

outputting an input-output signal that shifts to the first voltage level when the input signal shifts from the first voltage level to the second voltage level.

* * * * *